(12) United States Patent
Jain et al.

(10) Patent No.: US 6,389,374 B1
(45) Date of Patent: May 14, 2002

(54) OBDD VARIABLE ORDERING USING SAMPLING BASED SCHEMES

(75) Inventors: Jawahar Jain, Santa Clara, CA (US); Yuan Lu, Pittsburgh, PA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/187,055

(22) Filed: Nov. 5, 1998

Related U.S. Application Data

(60) Provisional application No. 60/088,039, filed on Jun. 3, 1998.

(51) Int. Cl.[7] .......................... G06F 17/10; G06F 17/50
(52) U.S. Cl. .................... 703/2; 716/3; 716/7
(58) Field of Search ........................ 703/2, 14; 716/5, 716/2, 7, 3

(56) References Cited

U.S. PATENT DOCUMENTS 6,086,626 A * 7/2000 Jain et al. .................. 716/5
6,212,669 B1 * 4/2001 Jain .............................. 716/7
6,301,687 B1 * 10/2001 Jain et al. .................. 716/3

OTHER PUBLICATIONS

Jain et al., J. Sampling Schemes for Computing OBDD Variable Orderings, 1998 IE International Conference on Computer–Aided Design, 1998, ICCAD '98, Digest of Technical Papers, pp. 631–638.*

Bei et al. 'A New Heuristic Algorithm for OBDD Variable Ordering', 98 ASIC On Proceedings, 96–738–01–0, pp. 354–357.*

Fujita, et al. 'Evaluation and Improvements of Boolean Comparison Method Based on Binary Decision Diagrams', IEEE CH2657–5/88/0000/0002, 1998, pp. 1–5.*

Minato, 'Zero–Suppressed BDDs for Set Manipulation in Combinarial Problems', 30th ACM/IEEE Design Automation Conference, 1993, pp. 272–277.*

Narayan et al. 'Partitioned ROBDDs—A Compact, Canonical and Efficiently Manipulable Representation for Boolean Functions', IEEE 1063–6757/96, 1996, pp. 547–554..*

Rudell, Dynamic Variable Ordering for Ordered Binary Decision Diagrams', Synopsis, Inc, IWLS '93, May 1993, pp. 1–12.*

(List continued on next page.)

*Primary Examiner*—Russell W. Frejd
(74) *Attorney, Agent, or Firm*—Christie, Parker & Hale, LLP

(57) ABSTRACT

A system and method for determining variable orders for decision diagrams. The variable orders are determined by sampling subspaces of a Boolean space representing a function or circuit. The subspaces are formed in a variety of ways, including through the use of abstraction, decomposition, partial assignments, and circuit subspaces.

36 Claims, 11 Drawing Sheets

OTHER PUBLICATIONS

Slobodova and Meinel, 'Sample Method for Minimization of OBDDs', International Workshop on Logic Synthesis, 1998, 10 pages.*

P. Ashar et al., Boolean Satisfiability and Eqivalence Checking Using General Binary Decision Diagrams, *Integration, the VLSI journal 13*, 1992, pp. 1–16.

J. Bei et al., A New Heuristic Algorithm for OBDD Variable Ordering, *'98 ASIC On Proceedings*, pp. 354–357.

B. Bollig et al., Improving the Variable Ordering of OBDDs is NP–Complete. *IEEE Trans. on Comp.*, vol. 45, No. 9, Sep. 1996, pp. 993–1002.

R. Bryant, Graph–Based Algorithms for Boolean Function Manipulation, *IEEE Trans. on Comp.* vol. C–35, No. 8, Aug. 1986, pp. 677–691.

R. Bryant, Symbolic Boolean Manipulation with Ordered Binary–Decision Diagrams, *ACM Computing Surveys*, vol. 24, No. 3, Sep. 1992, pp. 293–318.

P. Chung et al., Efficient Variable Ordering Heuristics for Shared ROBDD, *IEEE, CICC*, 1993, pp. 1690–1693.

R. Drechsler et al., Efficient Representation and Manipulation of Switching Functions Based on Ordered Kronecker Functional Decision Diagrams, *31st ACM/IEEE DAC*, 1994, pp. 415–419.

R. Drechsler et al., Genetic algorithm for variable ordering of OBDDs, *IEEE Proc.–Comp. Digital Techniques*, vol. 143, No. 6, Nov. 1996, pp. 364–368.

S. Friedman et al., Finding the Optimal Variable Ordering for Binary Decision Diagrams, *24th ACM/IEEE DAC*, Paper 21.2, 1987, pp. 348–356.

H. Fujii et al., Interleaving Based Variable Ordering Methods for Ordered Binary Decision Diagrams, *IEEE, ICCAD*, 1993, pp. 38–41.

M. Fujita et al., Evaluation and Improvements of Boolean Comparison Method Based on Binary Decision Diagrams, *IEEE, ICCAD*, Nov. 1988, pp. 2–5.

M. Fujita et al., On Variable Ordering of Binary Decision Diagrams for the Application of Multi–level Logic Synthesis, *IEEE EDAC*, 1991, pp. 50–54, J. Gergov et al., Efficient Boolean Manipulation with OBDD's can be Extended to FBDD's, *IEEE Trans. on Comp.*, vol. 43, No. 10, Oct. 1994, pp. 1197–1209.

N. Ishiura et al., Minimization of Binary Decision Diagrams Based on Exchanges of Variables, *IEEE ICCAD DAC*, Nov. 1991, pp. 472–475.

S. Jeong et al, Extended BDDs: Trading off Canonicity for Structure in Verification Algorithms, *IEEE, ICCAD*, 1991, pp. 464–467.

S. Jha et al., Equivalence Checking Using Abstract BDDs, *Proc. ICCAD, VLSI in Computers and Processors*, Oct. 1997, 6 pages.

S. Malik et al., Logic Verification using Binary Decision Diagrams in a Logic Synthesis Environment, *IEEE, ICCAD*, 1988, pp. 6–9.

K. McMillan, Symbolic model checking: An approach to the state explosion problem, Ph.D. Thesis, Dept. Of Comp. Science, Carnegie Mellon Univ., 1992.

M. Mercer et al., Functional Approaches to Generating Orderings for Efficient Symbolic Representations, *29th ACM/IEEE DAC*, Paper 38.4, 1992, pp. 624–627.

S. Minato, Zero–Suppressed BDDs for Set Manipulation in Combinatorial Problems, *30th ACM/IEEE DAC*, 1993, pp. 272–277.

A. Narayan et al., Partitioned ROBDDs—A Compact, Canonical and Efficiently Manipulable Representation for Boolean Functions, *IEEE ICCAD*, 1996, pp. 547–554.

S. Panda et al., Who are the Variables in Your Neighborhood, *IEEE ICCAD*, 1995, pp. 74–77.

S. Panda et al., Symmetry Detection and Dynamic Variable Ordering of Decision Diagrams, *ACM/IEEE ICCAD*, 1994, pp. 628–631.

C. Pixley, A Theory and Implementation of Sequential Hardware Equivalence, *IEEE Trans. on CAD*, vol. 11, No. 12, Dec. 1992, pp. 1469–1478.

R. Rudell, Dynamic Variable Ordering for Ordered Binary Decision Diagrams, *ICCAD*, May 1993, pp. 1–12.

A. Slobodova et al., Sample Method for Minimization of OBDDs, *IWLS*, 1998, 10 pages.

H. Touati et al., Implicit State Enumeration of Finite State Machines usign BDDs, *IEEE ICCAD*, Nov. 1990, pp. 130–133.

* cited by examiner

OBDD VARIABLE ORDERING USING SAMPLING BASED SCHEMES

CROSS-REFERENCE TO RELATED APPLICATIONS

This application claims the benefit of the filing date of U.S. Provisional Application No. 60/088,039, filed Jun. 3, 1998, the disclosure of which is incorporated herein by reference.

BACKGROUND OF THE INVENTION

This invention relates to very large scale integrated circuit design, testing and verification, and more particularly to systems and methods for determining variable orders for ordered binary decision diagrams.

Binary decision diagrams (BDDs) have been used to solve CAD related problems. These problems include synthesis problems, digital-system verification, protocol validation, and generally verifying the correctness of circuits. BDDs represent Boolean functions. For example, FIG. 1 shows a circuit comprising first and second OR gates 11, 13, and an AND gate 15. The first OR gate has inputs N1 and N2. The second OR gate has inputs N2 and N3, with input N2 being shared by the two OR gates. The outputs of the OR gates are fed into the AND gate. The AND gate has an output N6. Thus, the output of the AND gate can be represented by the Boolean function N6=(N1 OR N2) AND (N2 OR N3).

A BDD for this circuit is shown in FIG. 2. The BDD is composed of nodes, which may also be called vertices, and branches. Nodes from which no further branches extend are termed terminal nodes or terminals. The BDD is an Ordered BDD (OBDD) as each input is restricted to appearing only at one level of the BDD. The BDD may be reduced to a Reduced OBDD (ROBDD) as shown in FIG. 3. The rules for reducing OBDDs are known in the art. The importance of ROBDDs is that ROBDDs are unique, i.e., canonical. Thus, if two OBDDs reduce to the same ROBDD, the function of the circuits represented by the OBDDs are equivalent.

In most applications, ROBDDs are constructed using some variant of the Apply procedure described in R. E. Bryant, Graph-Based Algorithms For Boolean Function Manipulation, IEEE Trans. Computer C-35(8): 667–691, August 1986, the disclosure of which is incorporated by reference herein. Using the Apply procedure, the ROBDD for a gate g is synthesized by the symbolic manipulation of the ROBDDs of gate g's inputs. Given a circuit, the gates of the circuit are processed in a depth-first search manner until the ROBDDs of the desired output gates are constructed.

A large number of problems in VLSI-CAD and other areas of computer science can be formulated in terms of Boolean functions. Accordingly, ROBDDs are useful for performing equivalence checks. A central issue, however, in providing computer aided solutions and equivalence checking is to find a compact representation for the Boolean functions so that the equivalence check can be efficiently performed. ROBDDs are efficiently manipulable, and as previously stated, are canonical. In many practical functions ROBDDs are compact as well, both in terms of size (memory space) and computational time. Accordingly, ROBDDs are frequently used as the Boolean representation of choice to solve various CAD problems.

ROBDDs, however, are not always compact. In a large number of cases of practical interest, many ROBDDs representing a circuit or system described by a Boolean function may require space which is exponential in the number of primary inputs (PIs) to the circuit or system. This makes solving for equivalence an NP-hard problem. The large space requirement, either in terms of memory or computational time, places limits on the complexity of problems which can be solved using ROBDDs.

The size of a BDD depends on, among other items, the order in which variables are evaluated. For example, the Boolean function $a_1 \cdot b_1 + a_2 \cdot b_2 + a_3 \cdot b_3$ can be represented by an eight node BDD using a variable order $a_1, b_1, a_2, b_2, a_3, b_3$. Using a variable order of $a_1, a_2, a_3, b_1, b_2, b_3$, however, results in a BDD with sixteen nodes. Determining a good variable order is a non-trivial problem. In fact, determining the optimal variable order of an n variable function, which has as many as n! different orders of input variables, is an NP-complete problem.

Approaches to determining good variable orders can be divided into two groups, static approaches and dynamic approaches. In a static approach, a variable order is determined and then used throughout the process of building a BDD. In a dynamic approach the variable order changes during the building the BDD.

Often in a static approach a variable order is determined using a depth-first search or breadth-first search to determine topological closeness of variables. In other words, variables are chosen in the manner in which they appear to be most naturally grouped together in the structural description of a circuit. Static approaches, however, are often largely unsuccessful. One reason for the lack of success of static ordering approaches is that they do not conduct adequate analysis of the function.

Dynamic approaches make use of the fact that BDDs are generally built beginning from primary inputs and extending, node by node, to a primary output. In other words, intermediate BDDs are built for each node of the circuit, until finally the BDD for a primary output is built. In a dynamic approach, variable orders are permutated at the intermediate nodes such that some cost function (often the size of the resulting BDD) is minimized. An example of a dynamic approach is a sifting based approach. In a sifting based dynamic ordering scheme, a variable is successively moved (sifted) to each position in the ordering list, and a different BDD is built for each variable ordering. The variable is then assigned the position in the variable ordering which results in a smallest graph size. The process is then repeated for each variable in the graph.

Dynamic variable ordering approaches are, however, often unsuccessful. One problem is that the sifting approach may result in a variable ordering which, due to the mechanics of dynamic reordering, constrain the possible variable ordering to variable orders which will not result in a small size BDD. For example, in a sifting based dynamic reordering scheme sifting of a variable in one direction in the variable order may be halted if the sifting is resulting in progressively larger BDD sizes. In such a scheme the variable, or a set of variables, is essentially constrained within a band of positions in the variable order because positions immediately outside of the band result in larger BDDs. However, significantly greater shifting of the variable may result, at some point, in a BDD significantly smaller than the BDDs possible with the variable constrained to the band of positions. Thus, depending on the function and the initial variable order used, a BDD for the function may be trapped at a size representing a local minima in size, which may be too large to effectively build, even if a small size BDD could be built for the function. In addition, even when the sifting approach results in a final, small sized BDD, the sifting approach may take an excessive amount of time to perform variable reordering.

Furthermore, dynamic reordering techniques cannot be used in all applications. For example, some alternative BDD representations, such as GBDDs, IBDDs, and XBDDs, require that the variable order must not change during the building of a BDD. Further, some test generation applications and SAT-solvers place great importance on determining the order of input variables used to begin a search. Accordingly, there is a need for determining good static variable orders, as well as a need for determining good initial variable orders for dynamic reordering packages.

SUMMARY OF THE INVENTION

The present invention provides a method of determining a variable order for building a binary decision diagram for a Boolean function forming a Boolean space, the Boolean function representing a circuit design. In one form, the method comprises forming samples of the Boolean space representing the Boolean function, building test binary decision diagrams for the samples using a plurality of test variable orders, and determining the variable order for building the BDD using information regarding the size of the test BDDs. In one embodiment the samples of the Boolean space are formed by using partial assignments. In another embodiment the samples of the Boolean space are formed using abstract BDDs. In another embodiment the samples of the Boolean space are created using decomposed BDDs. In another embodiment the samples of the function are created using smaller portions of the circuit.

In forming the Boolean subspaces, parameters are used to influence the formation of the samples. These parameters include parameters relating to a set of primary input variables used for abstraction and in one embodiment the set of primary input variables is determined by simulating a portion of a circuit design. The parameters estimated in another embodiment are a set of decomposition points which may be determined randomly, when a BDD goes beyond a threshold value, or when a BDD operation exceeds a predetermined computer resource amount.

The present invention also provides a method of building BDDs representing a Boolean function, the Boolean function defining the Boolean space of a circuit design. In one embodiment the method preprocesses a circuit design by examining a plurality of subspaces of the Boolean space, determines a variable order based on examination of the Boolean subspace, and builds a BDD representing the Boolean function using the variable order of an initial variable order.

Many of the attendant features of this invention will be more readily appreciated as the same becomes better understood by reference to the following detailed description and considered in connection with the accompanied drawings in which like reference symbols designate like parts throughout.

DETAILED DESCRIPTION

I. Overview

The present invention uses a sampling technique to determine a variable order used to build a BDD for a circuit or function. A process of the present invention takes samples of the Boolean space representing the circuit or function and determines good variable orders for those samples of the Boolean space. Instead of samples of the Boolean space, another approach is to use portions of a circuit and analyze the portions to determine good variable orders. In other words, the process builds BDDs for portions of the function with a variety of variable orders, e.g., an ordered list of primary inputs, and, based on the resulting graph sizes or other parameters related to the BDDs, selects a best variable order for building a BDD for the entire function or circuit. By building BDDs using a variety of variable orders and for a variety of different portions of the Boolean space representing the circuit or function, information regarding good variable orders can be easily and quickly obtained. The best variable order selected from this process is then used, either as a static variable order or as an initial variable order in a dynamic variable order process, for building a BDD for the entire circuit.

The Boolean space representing the circuit or function is sampled using one or more of a variety of sampling techniques. The sampling technique selects a portion of the Boolean space for examination. In one embodiment, the sampling is performed by creating windows of the Boolean space using partial assignments. Partial assignments restrict some of the primary inputs to the circuit to assigned values. Assigning values to some of the primary inputs simplifies the circuit, and the BDD, for any primary output which depends on any primary inputs to which values are assigned.

Abstract BDDs are used in another embodiment to provide windows of the Boolean space representing a circuit or function. In abstract BDDs, nodes related to a given variable are classified into equivalence classes based on an abstraction function. An abstract BDD is formed by selecting one node from an equivalence class as representative of the entire equivalence class.

In another embodiment, decomposed BDDs are used to obtain the sampling windows. Decomposed BDDs are formed by introducing pseudo-variables at internal gates of the function or circuit, with the internal gates therefore forming decomposition points. The decomposition points are then used as pseudo-primary inputs to the circuit or function.

A process of the present invention can be divided into four phases. These phases include an estimation phase, a candidate order phase, a testing phase, and an evolution phase.

Figure 1:
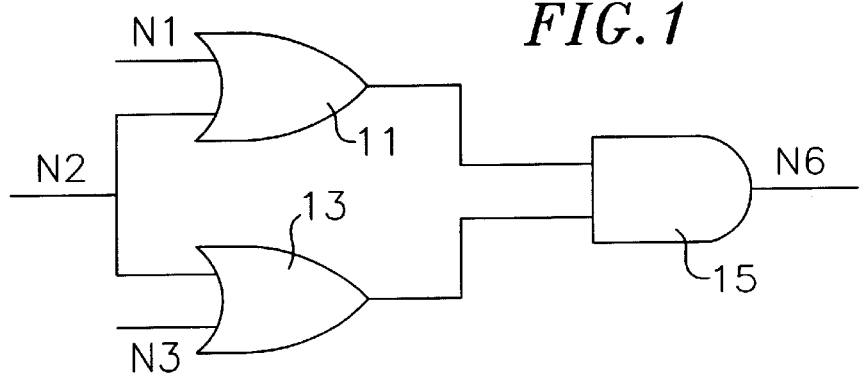
FIG. 1 is a logic design schematic illustrating the topology of a digital logic circuit.
Figure 2:
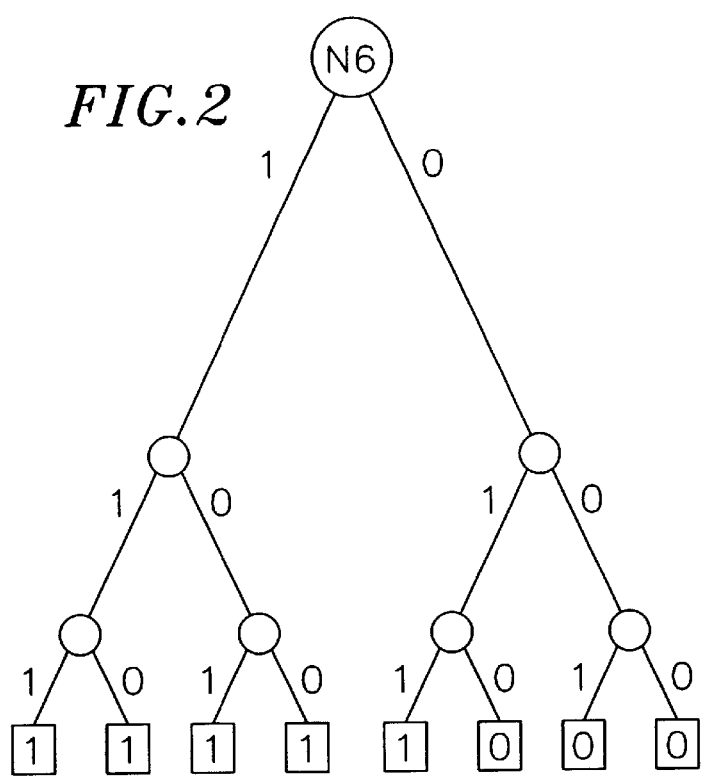
FIG. 2 is a Binary Decision Diagram capturing the functionality of the circuit of FIG. 1.
Figure 3:
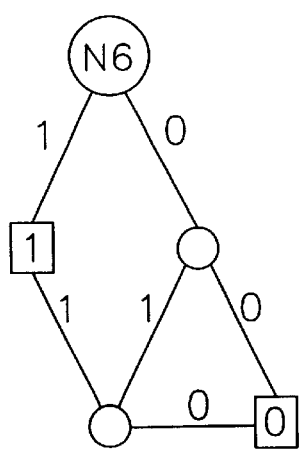
FIG. 3 is a reduced BDD of the BDD of FIG. 2.
Figure 4:
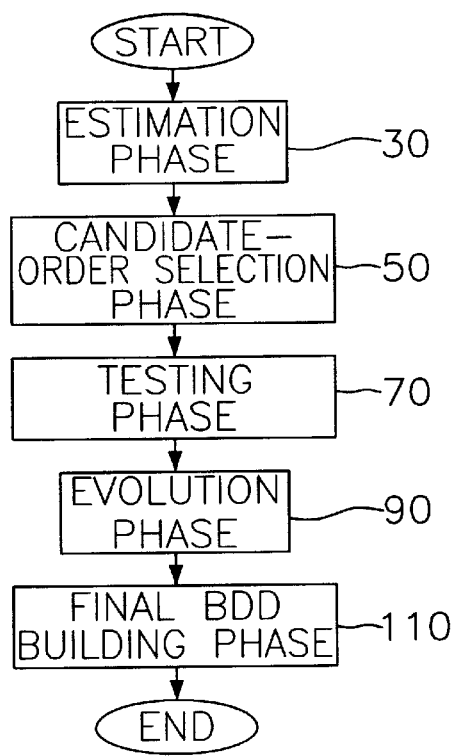
FIG. 4 is a flow diagram of a process of the present invention.

A flowchart of this process of the present invention is illustrated in FIG. 4. As illustrated in FIG. 4, in step 30 the process determines parameters related to the Boolean subspaces to be used as samples as part of the estimation phase. Generally, in the estimation phase the process determines how many and which partitions should be initially created to form candidate variable orders.

In step 50, representing the candidate order phase, the process creates and builds BDDs using dynamic reordering, for the Boolean subspaces determined during the estimation phase, generally using an initial variable order produced by a depth first search. For each subspace, the process builds at least one BDD. A different candidate variable order is generated for each BDD built due to the BDDs representing different subspaces and the effects of dynamic reordering.

In step 70 the process rejects inefficient variable orders as part of the testing phase. This is accomplished by building BDDs for different subspaces using the variable orders, or a subset of variable orders (a secondary variable order), derived in the candidate order selection phase. Variable orders which are inefficient in building BDDs for the new samples are removed.

In step 90 the process refines the variable orders provided by the earlier phases as part of the evolution phase. This is accomplished by applying the variable orders to yet further samples, and dynamically reordering the variable orders while building the BDDs for these samples. Based on the results of the evolution phase a sampling computed order representing the best variable order is selected. The sampling computed order is then used as an initial order for building the final BDD in step 110, either in the presence of dynamic reordering or as a static order.

II. Methodology Using Abstract BDDs

Abstract BDDs are BDDs representing a window, or partition of the Boolean space for a function. Accordingly, abstract BDDs may be used to form a Boolean subspace of a circuit design or function. Abstract BDDs are BDDs in which nodes with the same abstract value have been merged. Abstract BDDs, and how to form abstract BDDs, are discussed in S. Jha et al., *Equivalence Checking Using Abstract BDDS*, Proceedings of IEEE International Conference on Computer Design: VLSI in Computers & Processors (1997), the disclosure of which is herein incorporated by reference. Abstract values are determined using an abstraction function. An abstraction function is defined as $h:\{0,1\}^n \rightarrow D$ where n is the number of Boolean variables and D is an arbitrary domain. Thus, if in a BDD all occurrences of a given variable are assigned a unique level, then nodes on the unique level are classified into various equivalence classes with respect to the values produced by a given abstraction function. From each equivalence class a representative node is selected as a node representative of the entire equivalence class of nodes and the BDDs below this representative node are used as a representative graph for the entire equivalence class of nodes. In one embodiment, the first reached node in the equivalence class during traversal of the graph is chosen as the representative node. Because of the consistency property the subtree structure is preserved when abstraction is applied on different levels. At the same time, the consistency property guarantees that the complexity of performing abstraction on different levels is polynomial to the size of the domain of the abstraction function.

Figure 5:
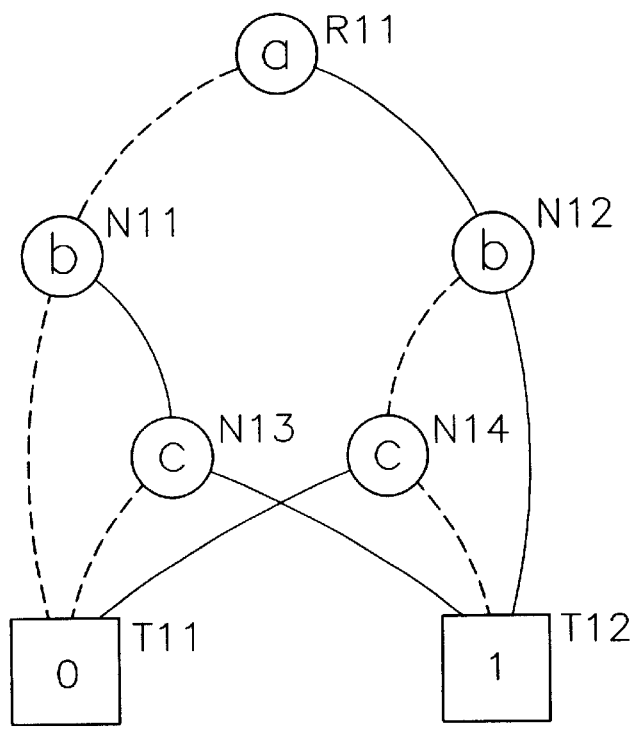
FIG. 5 is a BDD for a logic function.

For example, a BDD for a Boolean function $f=(a \cdot \bar{c})+(b \cdot c)$ is illustrated in FIG. 5. The BDD of FIG. 5 contains roots, nodes and terminals connected by branches. A logic 0 branch is illustrated as a dotted line. A logic 1 branch is illustrated as a solid line. The BDD of FIG. 5 has a root R11. Root R11 has a logic 0 branch connected to node N11 and a logic 1 branch connected to node N12 Node N11 has a logic 0 branch connected to terminal T11 and a logic 1 branch connected to node N13. Node N12 has a logic 0 branch connected to node N14 and a logic 1 branch connected to terminal T12. Node N13 has a logic 0 branch connected to terminal T11 and a logic 1 branch connected to terminal T12. Node N14 has a logic 1 branch connected to terminal T11 and a logic 0 branch connected to terminal T12.

Figure 6:
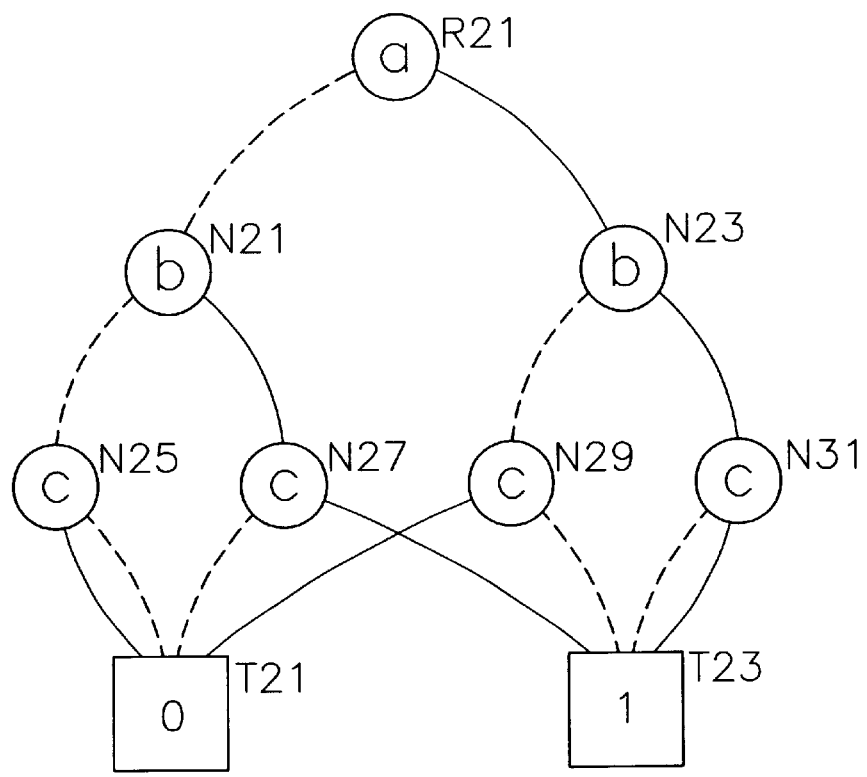
FIG. 6 is a levelized BDD of the logic function of FIG. 5.

FIG. 6 illustrates the BDD of FIG. 5 after levelization. Levelization modifies a BDD by inserting, for the variable level being levelized, sufficient nodes such that each branch from a level immediately above the variable level being levelized goes to a node on that level. Accordingly, the BDD of FIG. 6, which has roots, nodes, terminals, logic 0 branches illustrated by dotted lines, and logic 1 branches illustrated by solid lines, has a root R21. Root R21 has a logic 0 branch connected to node N21 and a logic 1 branch connected to node N23. Node N21 has a logic 0 branch connected to node N25 and a logic 1 branch connected to node N27. Node N23 has a logic 0 branch connected to node N29 and a logic 1 branch connected to node N31. Nodes N25, N27, N29, and N31 connect to the terminals T21 and T23. Node N25 has both logic 0 and 1 branches connected to terminal T21 and node N31 has both logic 0 and logic 1 branches connected to terminal T23. Node N27 has a logic 0 branch connected to terminal T21 and a logic 1 branch connected to terminal T23. Conversely, node N29 has a logic 0 branch connected to terminal T23 and a logic 1 branch connected to terminal T21.

Figure 7:
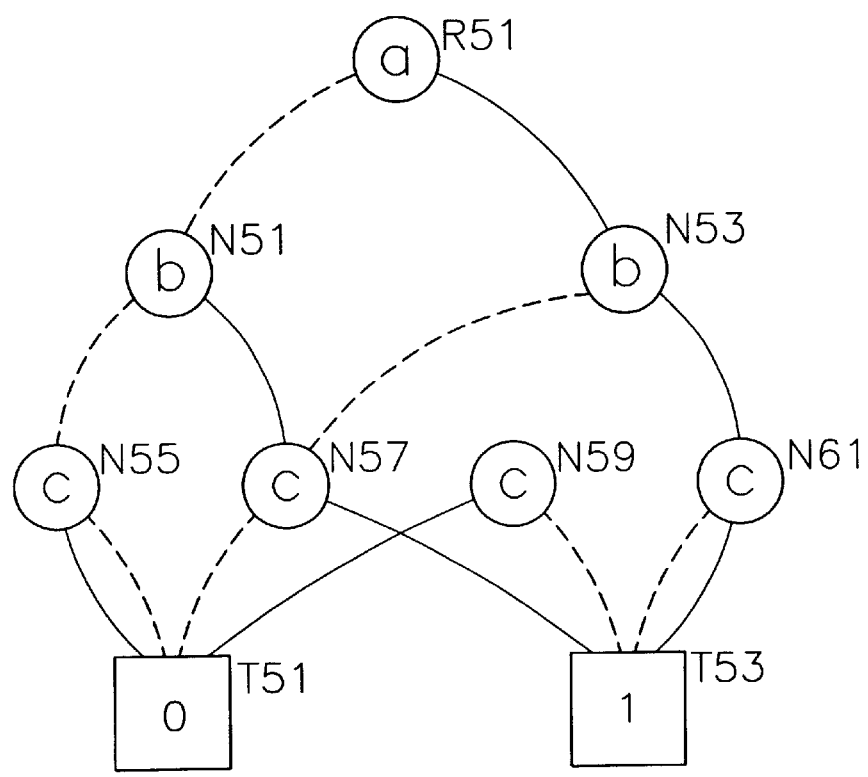
FIG. 7 is an abstract BDD of the logic function of FIG. 5 using a symmetry abstraction function.

FIG. 7 illustrates the BDD of FIG. 6 after abstraction is performed using a symmetry abstraction function h=a+b. ab=01 and ab=10 have the same abstract value, therefore, one of the ab=01 and ab=10 subtrees is ignored. Thus, in FIG. 7 root R51 has a logic 0 branch connected to node N51 and a logic 1 branch connected to node N53. Node N51 has a logic 0 branch connected to node N55 and a logic 1 branch connected to node N57. Node N53 has a logic 0 branch connected to node N57 and a logic 1 branch connected to node N61. Node N55 has both logic 0 and logic 1 branches connected to terminal T51 and similarly, node N61 has both logic 0 and logic 1 branches connected to terminal T53. Node N57 connected to node N51 and N53 has a logic 0 branch connected to terminal T51 and a logic 1 branch connected to terminal T53. Node N59 is at the same level as nodes N55, N57 and N61, but has no connection to any of the nodes in the BDD. Node N59 has a logic 0 branch connected to terminal T53 and a logic 1 branch connected to terminal T51.

Figure 8:
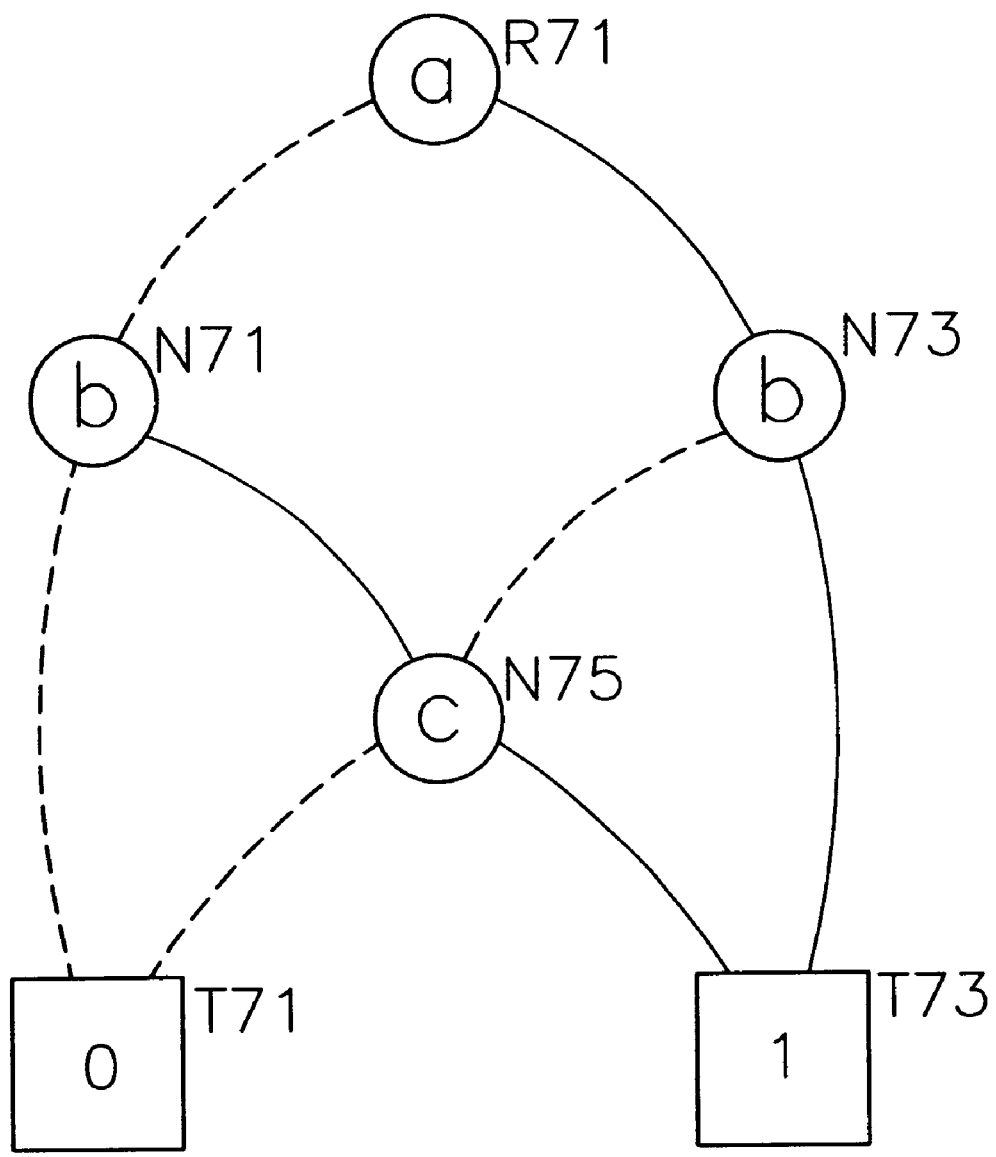
FIG. 8 is a reduced abstract BDD of the logic function of FIG. 5.

FIG. 8 illustrates the abstract BDD of FIG. 7 after reduction. Reduction is the process of merging nodes with isomorphic subtrees and removing redundant nodes. Accordingly, in FIG. 7 root R71 has a logic 0 branch connected to node N71 and a logic 1 branch connected to node N73. Node N71 has a logic 0 branch connected to terminal T71 and a logic 1 branch connected to node N75. Node N73 has a logic 0 branch connected to node N75 and a logic 1 branch connected to terminal T73. Node N75 connected to both node N71 and N73 has a logic 0 branch connected to terminal T71 and a logic 1 branch connected to terminal T73.

Abstract BDDs provide a way to realize a window sampling method. Given a set of control variables, an abstract BDD is built according to a given abstraction function. The control variables are determined by traversing the circuit in depth-first order, considering the minimum depth from primary inputs to some internal gate. Thus, the abstraction function may be applied during the building of BDDs for each node in a circuit design. However, the abstraction function may also be applied only at selected nodes, such as nodes forming a cutset of the circuit. Then, the abstract BDDs are propagated to the primary outputs using ordinary BDD operations, with dynamic reordering in one embodiment. Usually the abstract BDDs are much smaller than the original BDDs. The functionality (satisfying set) of the abstract BDD captures a subset of the given function (or, its satisfying set). Thus, a good order on abstract BDD graph is likely to be useful for building a BDD for the original function.

A. Estimation

Figure 9:
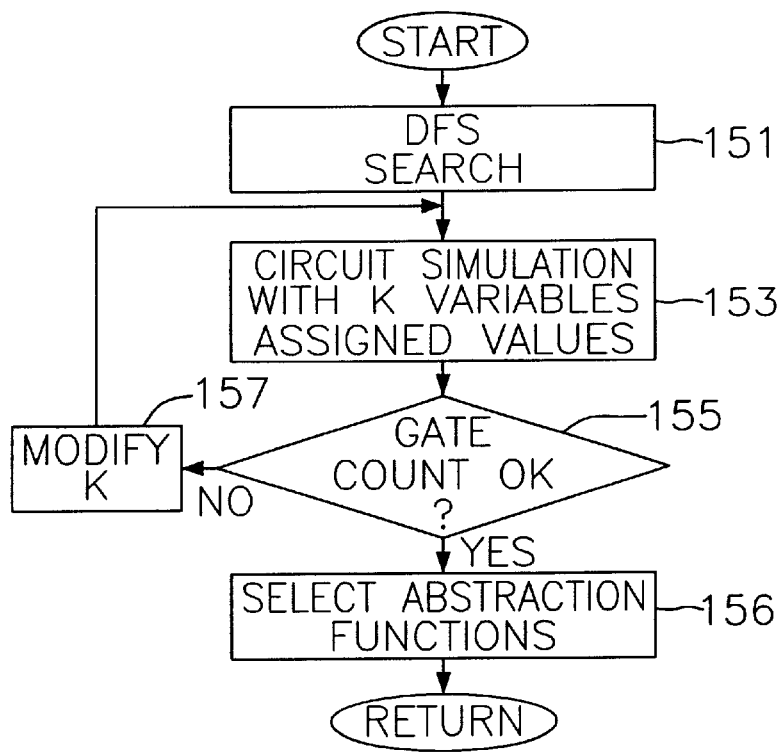
FIG. 9 is a flow diagram of an estimation subprocess phase using abstraction subspaces.

FIG. 9 illustrates a flow diagram of an estimation phase subprocess for subspaces formed using abstraction principles. The estimation phase subprocess determines abstraction variables and abstraction functions. In step 151, the subprocess performs a depth-first search. Depth-first searches, and methods for performing depth-first searches, are well known in the art. The depth-first search provides an ordered list of primary inputs, i.e. variables.

Variations of depth-first searches may be used. For example, in another embodiment, the ordered list of primary input variables is produced using a priority depth-first search. In a depth-first search a circuit or function is traversed from a primary output to the primary inputs. When a gate with multiple inputs is encountered during this traversal one of the inputs is selected, without analysis, as the first wire upon which to proceed for further traversal. A priority depth-first search prioritizes multiple inputs to a gate. Inputs to a gate which are closest to the primary inputs are first selected for traversal in the priority depth-first search. The distance of a wire from a primary input or primary output is determined using a levelized circuit, and methods of performing circuit or function levelization are well known in the art. By levelizing the paths from the primary inputs to the primary outputs of the circuit design, it can be determined by counting the gates to the primary inputs from the inputs in question which input is closest to the primary inputs.

In step 153, the subprocess simulates the circuit with values assigned to the first k variables in the list. Circuit simulators capable of performing such a simulation are pervasive and well known in the art. The circuit simulation provides information as to how many variables should be used in the abstraction process. During circuit simulation in step 153, the subprocess observes the effects on the circuit of assigning values to the k variables, specifically by noting the number of gates which remain in the circuit, i.e. gates whose output values are not fully determined by assigning values to the k variables. In step 155, the subprocess determines whether the number of gates which remain in the circuit provides a suitable basis for subspace selection. In the subprocess of FIG. 9 the initial selection of the value k is such that a large percentage of variables are assigned values. Accordingly, only a small number of gates are expected to remain in the circuit. As the value of k is progressively reduced, and therefore fewer variables are assigned values, the number of gates remaining in the circuit generally increases. In the embodiment illustrated in FIG. 9 the number of gates providing a suitable basis for subspace selection is the number of gates remaining when a decrease in the value of k results in a dramatic increase in the number of gates remaining. Other criteria, however, could also be used. For example, the criteria could be a predetermined number of gates, a predetermined percentage of gates, or when changes to the value of k do not result in significant changes to the number of gates remaining in the circuit. Alternatively, k can initially be set to a small number, including zero, and progressively increased. In this alternate method, the final value of k is the value of k at which the gate count of the circuit exhibits a significant decline. The size of the subspaces, and therefore the appropriate gate count, are dependent on physical parameters, such as memory size, processing speed, and processing power used in performing the process of the present invention.

If the subprocess determines that the number of remaining gates is not suitable, then the process modifies the k value in step 157. If too few gates remain in the circuit then the subprocess decreases the value of k, and if too many gates remain in the circuit the process increases the value of k. If the process determines that the number of remaining gates is suitable in step 155, then the subprocess selects abstraction functions in step 156.

Intuitively, the abstraction function should consist of a number of diverse subspaces. At the same time, these subspaces should reflect the property of the original circuit. Five potential abstraction functions are provided in Table I, in which P and $P_i$ are prime numbers, n, q, p and K are integers, and $X_i$ is a Boolean variable. Those skilled in the art would realize that a number of unlisted, but known, abstraction functions could be used.

TABLE I

| Name | Definition | # Subspaces |
|---|---|---|
| symmetry | $\sum_{i=0}^{n-1} X_i$ | n |
| residue | $\sum_{i=0}^{n-1} (2^i X_i) \bmod P$ | p |
| logarithm | $\log_2 \sum_{i=0}^{n-1} (2^i X_i)$ | n |
| hashing | $\sum_{i=0}^{n-1} (P_i X_i) / 2^q$ | $2^{32-q}$ |
| division | $\sum_{i=0}^{n-1} (2^i X_i) / P$ | $2^n/K$ |

B. Candidate Order Selection

In the candidate-order selection phase, some m different abstraction functions are applied on the top k variables and abstract BDDs are built for the Boolean function with dynamic reordering on. This process generates m different variable orders, which are candidate variable orders. In one embodiment, approximately two to three samples are picked and used in the subsequent phases to reject and refine these variable orders.

Figure 10:
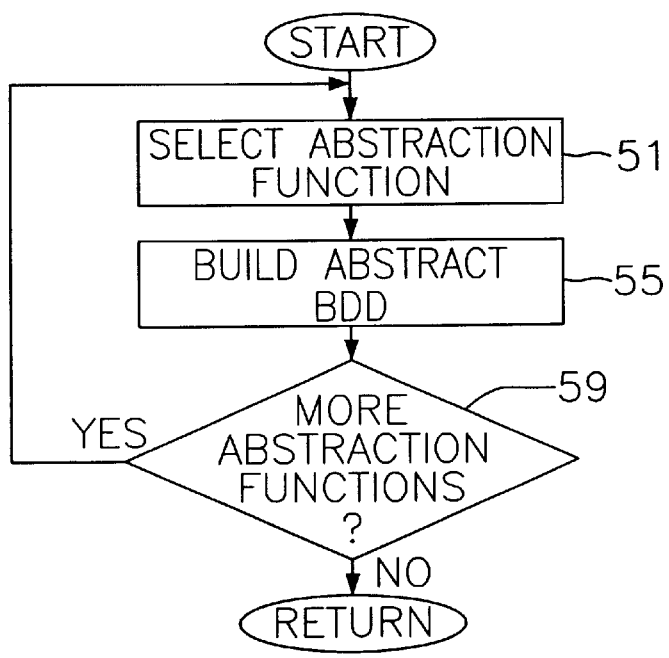
FIG. 10 is a flow diagram of a candidate order subprocess phase using abstraction subspaces.

FIG. 10 illustrates a flow diagram of a subprocess of the candidate order phase. In step 51, the subprocess selects one of the abstraction functions identified during the estimation phase. In step 55, the subprocess builds an abstract BDD for the selected abstraction function in a manner as previously described, with the first k variables selected as the control variables to which an abstraction function is applied. The building of the abstract BDDs is started using the variable order provided by the depth-first search, and is done using dynamic reordering. As each abstract BDD is formed using a different abstraction function each abstract BDD represents a different window, or subspace, of the function representing the circuit design. Accordingly, due to the effects of dynamic reordering each abstract BDD will generally have a different final variable order, the final variable order being the last variable order used in building the given abstract BDD. The final variable order for each abstract BDD is a candidate variable order. In step 59 the subprocess determines if more abstraction functions need to be examined. If more abstraction functions remain to be examined, then the subprocess goes to step 51 and selects an abstraction function. Otherwise, the subprocess returns.

C. Testing

At the end of the candidate order phase, the process has determined m variable orders. The process narrows the set of m variable orders to x variable orders, e.g., a secondary variable order with x<m, in the testing phase by removing inefficient variable orders. This is accomplished by using the candidate variable orders to build BDDs for additional subspaces and examining the size of the resulting BDDs, as well as, in one embodiment, the time required to build the BDDs.

Circuit Filter Scheme

In one embodiment of the process in the testing phase, the process removes the inefficient variable orders from the set of m variable orders using a circuit filter scheme. Using the circuit filter scheme, the process selects one of the m variable orders and builds a BDD up to a target node within the circuit design or Boolean space with dynamic reordering off. The target node can be any node within the circuit design. The BDD for the target node therefore represents a Boolean subspace for the circuit design or function. Accordingly, other methods of forming Boolean subspaces could instead be used. In one embodiment, the target node is a node between the primary inputs up to a threshold level, such as the middle of the circuit. In another embodiment, the target node is selected by locating a node at the threshold level which has the largest number of primary inputs connecting to the node as compared to the other nodes at the threshold level. As the process builds the BDD using the circuit filter scheme, if the BDD starts to become exceedingly large, the process determines that the variable order is an inefficient variable order and removes the variable order from the set of m variable orders. The process continues by building a BDD up to the target node within the circuit design or Boolean space with dynamic reordering off for each one of the m variable orders. As a result, the inefficient variable orders are removed from the set of m variable orders and x variable orders are produced.

Figure 11:
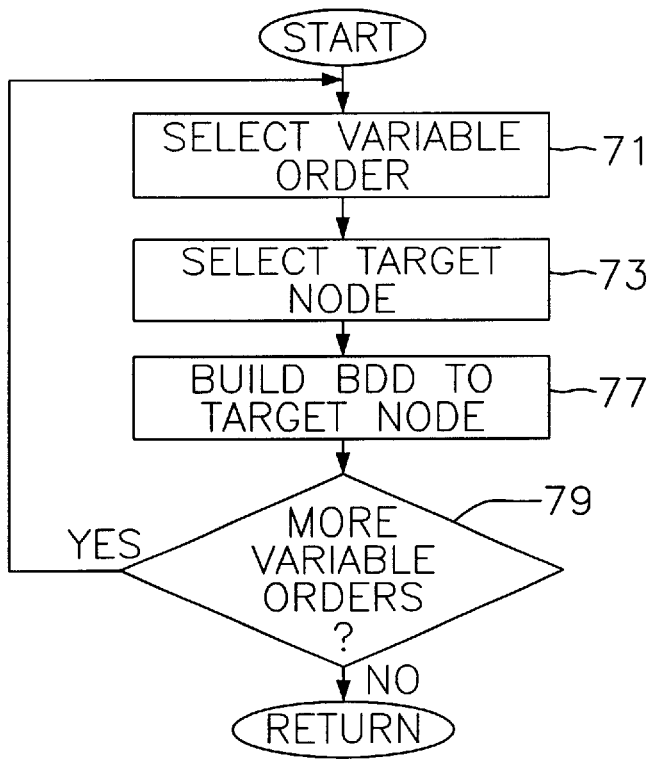
FIG. 11 is a flow diagram of a circuit filter subprocess.

FIG. 11 illustrates a flow diagram of a subprocess of the circuit filter scheme. The subprocess selects a variable order in step 71. In step 73, the subprocess selects a target node. The target node is a node within the circuit in a region between the primary inputs up to a threshold level. More specifically, in the process of FIG. 11, the target node is a node within that region which has the largest number of primary inputs and the threshold level is chosen to be the middle of the circuit. Once the target node is identified by the subprocess, a BDD is built for the target node in step 77. The BDD is built using the primary inputs as starting points to the target node. If a BDD cannot be built, the variable order selected by the subprocess in step 71 is discarded. If the BDD built is extremely large, then the variable order selected by the subprocess in step 71 is discarded. If none of these conditions exist and in step 79 the subprocess determines that more variable orders exist, then the subprocess goes to step 71. If all of the variable orders have been examined by the subprocess, then the subprocess returns and the circuit filter scheme is complete.

The circuit filter scheme forms a subspace of a circuit, and can therefore be viewed as a circuit sampling technique for forming a sample of a circuit design. Other methods of circuit sampling, in which a limited exploration of a circuit is conducted, are also possible. For example, building a BDD for a primary output of the circuit for a fixed number of levels in the circuit, or merely until reordering calls exceed some predefined level, are other examples of circuit based sampling. As with the other sampling methods, circuit based sampling methods may also be used in, or use, all of the other phases.

Figure 12:
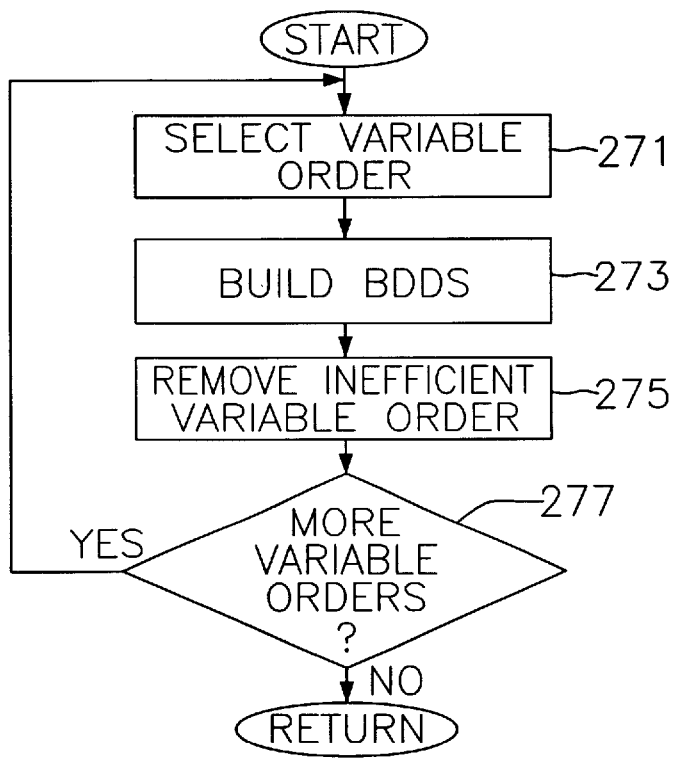
FIG. 12 is a flow diagram of a testing subprocess.

The more generalized process of the testing phase is illustrated in FIG. 12. The subprocess of FIG. 12 uses each variable order candidate to build BDDs for multiple subspaces. Variable order candidates which result in large size BDDs are removed as inefficient variable orders. Accordingly, in step 271 the subprocess selects a candidate variable order. In step 273 the subprocess uses the candidate variable order as an initial variable order for building BDDs for multiple subspaces. In one embodiment, the building of the BDDs is accomplished without dynamic reordering. In step 275 the subprocess examines the BDDs built with the selected candidate variable order and removes the candidate variable order from the list of candidate variable orders if large size BDDs result from use of the candidate variable order. In step 277 the subprocess determines if more candidate variable orders remain in which case the subprocess returns to step 271. Otherwise the subprocess returns.

Indeed, in a simple version of sampling only the test phase need be used, with variable orders randomly assigned and the variable order resulting in the smallest size BDD for a subspace or a set of subspaces selected. Even for circuits for which BDDs can be built in a reasonable amount of time such a sampling technique may provide a multitude of benefits.

For example, in many applications (such as some synthesis applications) the time T_bdd to construct the BDD of some function F is a very small fraction of the total runtime (T_total) to complete the synthesis. That is, T_total>>T_bdd.

However, T_total critically depends on the size of BDD F. Thus, even if a significant amount of time is used in determining a good variable order for F (that is, say, T_bdd gets increased by a factor of 10), it is worth the effort, since T_total will be now greatly reduced.

In addition, in some applications an efficient variable order is required for a BDD manager, which is a shared representation of all the BDDs existing at any time.

When reordering is triggered on a given BDD manager, then the new order of the manager can be computed through the process of sampling. In such a case, the sampled space (function) is directly computed on the manager, using, for example, either the abstract BDDs or using the partial assignments.

Further, a relevant fraction (sample subspace) of the BDD manager can be chosen in a variety of ways. For example, suppose a partial assignment x1=0, x2=1, x3=0 is made. This assignment should be preferred over other assignments, if the BDD it yields has many nodes which are shared by many paths that originate from the root variable. For example, using 3 variables, 8 paths can originate from the root variable. It there are as many as 5 paths lead to many nodes in the subgraph of x1=0, x2=1, x3=0. Then, clearly it is a better subspace for sampling then subspaces that may be produced by other partial assignments.

Testing Scheme

In another embodiment of the process in the testing phase, the process removes the inefficient variable orders from the set of m variable orders by using a testing scheme. Using the testing scheme, the process selects one of the m variable orders and builds BDDs for a new set of Boolean subspaces with dynamic reordering on. The new set of. Boolean subspaces is determined by performing an abstraction using an abstraction function, although other methods of forming subspaces could also be used. The process continues by building BDDs for the new set of Boolean subspaces with each one of the m variable orders. The variable order which produces the smallest sized BDDs is determined by the process to be the best variable order.

Averaging Scheme

In another embodiment of the process in the testing phase, the process removes the bad variable orders from the set of m variable orders by using an averaging scheme. Using the averaging scheme, the process merges the m variable orders to produce a final variable order. The merging of the m variable orders is performed by the process using an averaging function.

One embodiment of the averaging function is a function relating the variable orders which produce non-trivial or large BDDs for a set of Boolean subspaces to the variable orders which produce trivial BDDs for the same set of Boolean subspaces. Essentially, the more Boolean subspaces and variable orders used and compared the more precise averaging function can created.

For I a finite set of variable ids, an order over I is defined to be a sequence of elements of I where no element appears more than once. For u an order over I, i∈u if i appears in u; for i∈u, pos(i,u) is the position (index) of i in u.

Suppose for some t and for all r, $0 \leq r \leq t$, an order $u_r$ and an positive integer-valued weight $w_r$ are provided, where for each i∈I, there is an r that i∈$u_r$. Further, the rank of each element of I is defined as follows (in each of the sums, r ranges over values such that i∈$U_r$).

$$\text{rank}(i) = \frac{\sum_r (pos(i, u_r) \times w_r)}{\sum_r w_r}$$

The average order of the inputs is then defined as the indices in I in increasing order of rank.

This definition is used to define a number of averaging functions, using different choices for the weights $w_r$.

There are many options as to how to combine the candidate orders. For example, each variable order can be viewed as a string, with common substrings located in each of the variable orders. Alternatively, average orders may be determined as a string and find out common "substrings" among various candidate orders. Furthermore, some average order can be computed using different (efficient) orders.

In addition, a set of various candidate orders, or subset of candidate orders, can be combined by other techniques. One such technique is genetic algorithm based technique where given a population of variable orders, different orders are combined to yield better orders. Simulated annealing based optimizations can also be applied to improve the variable order. For example, partial BDDs can be constructed using candidate orders, and then an annealing process is performed to determine the better variable orders. Partial BDD based simulated annealing is well known, and has been discussed in detail in *Mercer* et al., Functional Approaches to Generating Orderings for Efficient Symbolic Representations, 29th ACM/IEEE Design Automation Conference, pp. 614–619 (1992), the disclosure of which is incorporated by reference herein.

Additionally, a set of variable orders can be combined using other similar techniques such as the variable interleaving technique and the variable appending technique which are discussed in *Fujii* et al., Interleaving Based Variable Ordering Methods For Ordered Binary Decision Diagrams, Proceedings of International Conference on Computer Aided Design, pp. 38–41, 1993, the disclosure of which is incorporated by reference herein. Another similar technique of combining a set of variable order is the adaptive selecting variable ordering technique discussed in Bei et al., A New Heuristic Algorithm for OBDD Variable Ordering, 98 ASIC on Proceedings, pp. 354–357, 1998, the disclosure of which is incorporated by reference herein.

D. Evolution

In the evolution phase the process determines the best order from the set of variable orders generated by the process in the testing phase. Further refinement of the variable orders is performed by using the variable orders as initial orders to a reordering package while building the BDD for the Boolean function of the circuit in independently chosen Boolean subspaces, formed, for example, by using an abstraction function or other methods. The Boolean subspaces are chosen by performing an abstraction using abstract BDDs. The final product of the evolution phase is the final variable order in which the final BDD is built.

Figure 13:
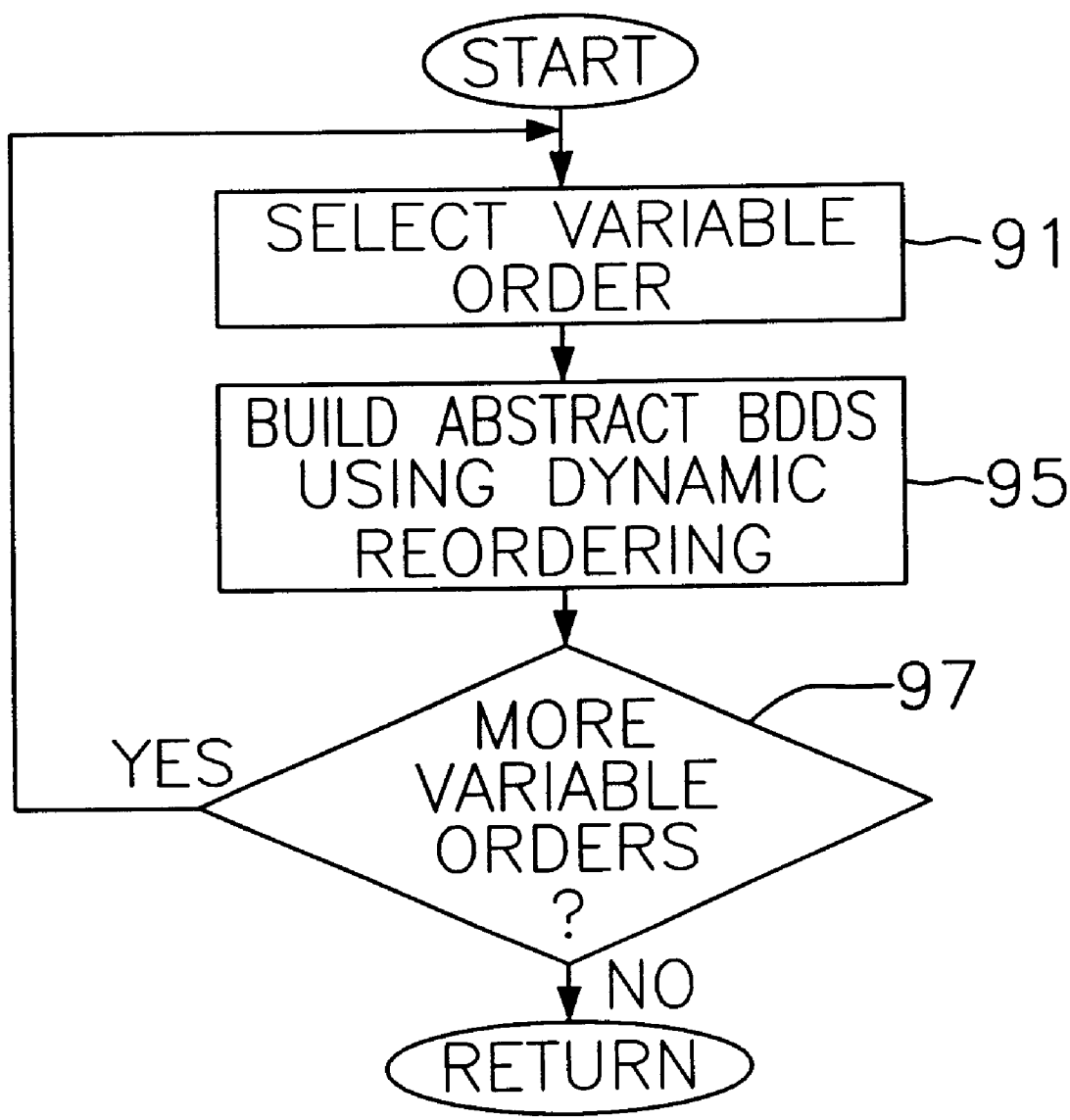
FIG. 13 is a flow diagram of a portion of an estimation phase subprocess for determining decomposition points for decomposition point subspaces.

FIG. 13 illustrates a flow diagram of a subprocess of the evolution phase using abstraction. A variable order is selected by the subprocess in step 91. In step 95, the subprocess builds the abstract BDDs. The BDDs built in step 95 are examined by the subprocess to determine if the size of the BDD is too large in which case the variable orders are reordered by the subprocess to create a smaller BDD. If the BDD cannot be built or is still too large after reordering, the variable order is discarded. If the variable order is not discarded, then the subprocess checks for more variable orders in step 97. If more variable orders exist, then the subprocess repeats steps 91 and 95. If no more variable orders exist, then the subprocess returns and the evolution phase is complete.

In addition, the testing and evolution phases, alone or in conjunction, also may be repeatedly performed. This may be accomplished, in some embodiments, using differing methods of forming subspaces or merely different subspaces.

E. Building

The building of the BDD for the circuit is performed by the process using the final variable order produced by the evolution phase. Static or dynamic ordering processes can be used with the final variable order as the initial order to produce the final optimal BDD for the circuit.

III. Methodology Using Decomposed BDDs

Decomposed BDDs are BDDs in which some internal nodes have been replaced by decomposition points. The final BDD therefore will be in terms of both primary inputs and decomposition point variables. Decomposed BDDs are further described in U.S. patent application Ser. No. 08/964,904, filed Nov. 5, 1997, the disclosure of which is incorporated herein by reference. A decomposed BDD representation of a circuit is obtained by introducing new variables at some internal gates which are called decomposition points, and building the BDD for the output using both primary inputs and decomposition point variables. Let $G_d(\Psi,X)$ be the decomposed BDD representation of the original function, and $\psi=\{\psi_1, \psi_2, \ldots, \psi_k\}$ as a decomposition set of the function.

For every decomposition point $\psi_i \epsilon \Psi$, there exists an OBDD $\psi_{i_{bdd}}$ representing the functionality of $\psi_i$ in terms of primary inputs as well as (possibly) other $\psi_j \epsilon \Psi$, where j<i. Let $\psi_{bdd}=\{\psi_{1_{bdd}}, \ldots, \psi_{k_{bdd}}\}$ represent the array containing the OBDDs of decomposition points in $\Psi$. The variable $\psi_i$ can be substituted by the function $\psi_{i_{bdd}}$ within $G_d$ using the composition operation:

$$G_d(\Psi, X) \cdot (\psi_i \leftarrow \psi_{i_{bdd}}) = \psi_{i_{bdd}} \wedge G_d(\Psi, X)_{\overline{\psi_i}} + \psi_{i_{bdd}} \wedge G_d(\Psi, X)_{\psi_i}.$$

Different windows are obtained when different values are assigned to the decomposition set $\Psi$. Based on those assignments, which can be deterministically or randomly generated, the original function is composed using the procedure in Table II.

TABLE II

```
f = G_{d_i}
for (i = k; i > 0; i = i - 1)
    if (ψ_i = 0)
        f = f ∧ ψ_{i_bdd};
    else if (ψ_1 = 1)
        f = f ∧ ψ_{i_bdd};
    else
        f = compose (f, ψ_i, ψ_{i_bdd});
    endif;
```

A. Estimation

The estimation phase determines decomposition points and decomposition point value assignments. Decomposition points are determined in several ways. In one embodiment, decomposition points are added randomly, or whenever a Boolean operation appears to result in a BDD exceeding memory or time constraints. To illustrate this latter point, consider evaluating f=(g⊙h) for some Boolean operation ⊙. If size(f)>C×[size(g)+size(h)] and size(g)>size(h), where size() refers to the BDD size of the argument function, a new variable $\psi_i$ is introduced at g. Note, C is a constant which can be either defined by user or set automatically. In addition, decomposition points are added whenever an individual OBDD grows beyond a threshold predetermined value. Thus, a decomposition point is introduced whenever size(f)>threshold limit.

A final variable order is not, however, in terms of decomposition point variables. Accordingly, the Boolean subspace is simplified by assigning values to the decomposition point variables. However, some values that nodes represented by decomposition point could be assigned may be in a controllability don't care set, which is a set of value assignments which either cannot be produced in a given circuit or are irrelevant to operation of a given circuit. Accordingly, simulation values are used to determine value assignments for decomposition points.

Figure 14:
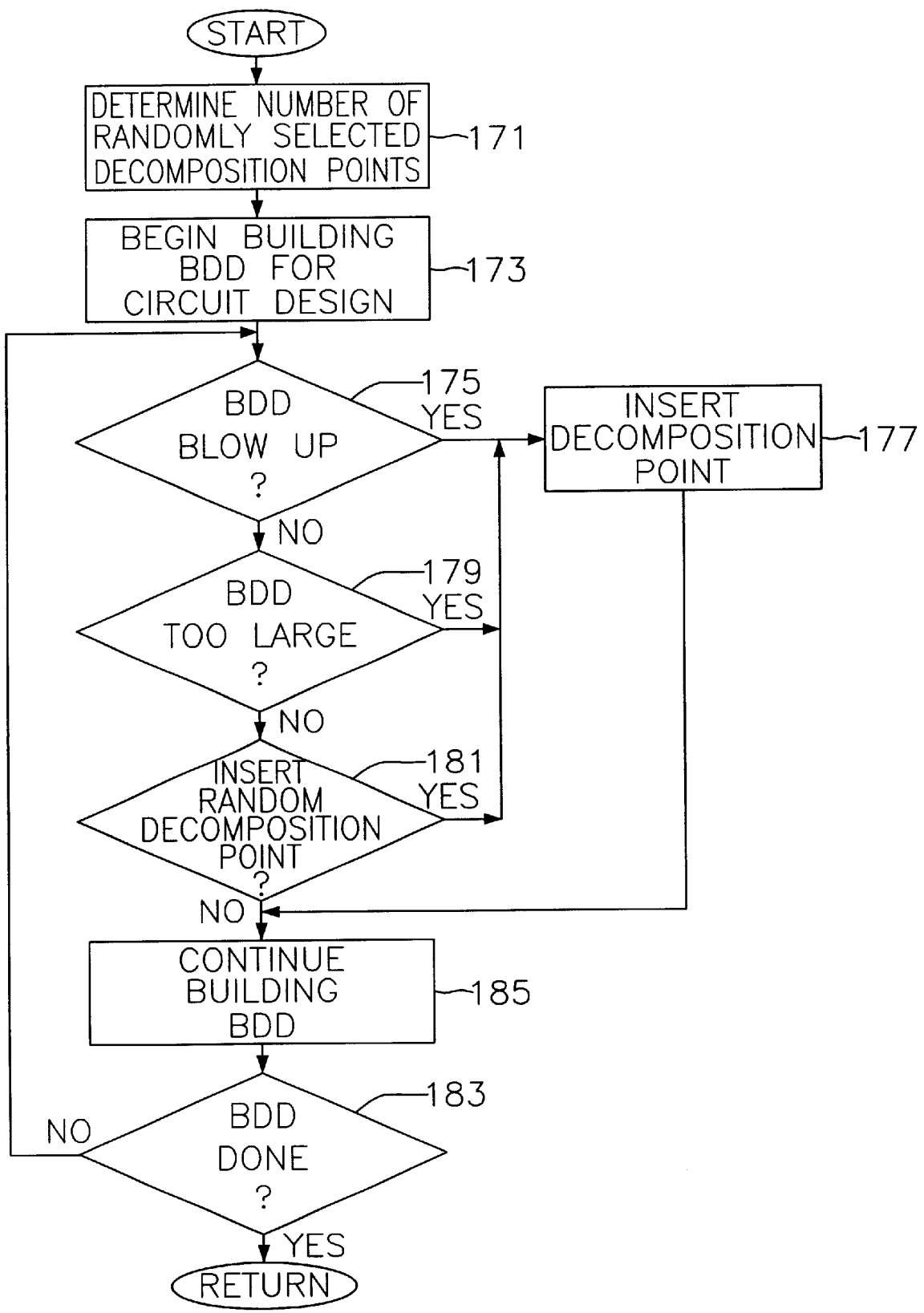
FIG. 14 is a flow diagram of a portion of an estimation phase subprocess for decomposition point subspaces.

FIG. 14 illustrates a flow diagram of a subprocess of the estimation phase for determining decomposition points in a decomposition based subspace sampling scheme. The subprocess illustrated in FIG. 14 determines decomposition points. In step 171, the subprocess selects a random number of decomposition points within the circuit. In step 173, the subprocess begins building a BDD for the circuit design, starting from the primary inputs and building the BDD gate by gate. The initial variable order used for building the BDD is derived by performing a breadth-first search, a depth-first search, or some variant of a depth-first search. In step 175, the subprocess examines the BDD being built to determine if the BDD is "blowing up", i.e., growing at rate indicating that the final BDD will be too large, either in terms of time or memory, e.g., a predetermined computer resource amount, to be built. If the subprocess determines that the BDD is blowing up, then in step 177 the subprocess inserts a decomposition point, and in step 185 the subprocess continues building the BDD using the inserted decomposition point. If in step 175 the BDD is determined not to be blowing up, then the subprocess examines the BDD size in step 179. If in step 179 the subprocess determines that the BDD is too large, then the subprocess inserts a decomposition point in step 177 and continues building the BDD in step 185. If in step 179, the subprocess determines that the BDD size is not too large, then the subprocess determines if a random decomposition point should be inserted in step 181. If the subprocess determines that a random decomposition point should be inserted, then the subprocess inserts a decomposition point in step 177 and continues building the BDD in step 185. However, if the subprocess determines that a random decomposition point does not need to be inserted, then the subprocess continues to build the BDD in step 185. In step 183, the subprocess determines if the building of the BDD is complete. If the building of the BDD is done, the subprocess ends. Otherwise, the subprocess continues to step 175.

In another embodiment the estimation process is dynamic. In a dynamic estimation process initially only a small number of decomposition points are selected in a window. The function is then composed inside the window. If during composition the BDD blows up then the BDD is partitioned by either assigning a Boolean value to one of the functions that remain to be composed or assigning Boolean assignments to some of the primary input variables in the given function. Alternatively, a threshold value can be set and the BDD is partitioned until the BDD size is below the threshold value. Similarly, if the number of decomposition points chosen makes the window very small (that is, the sampled BDD is of trivial size) then the process decreases the number of decomposition points that are selected in the given window.

Figure 15:
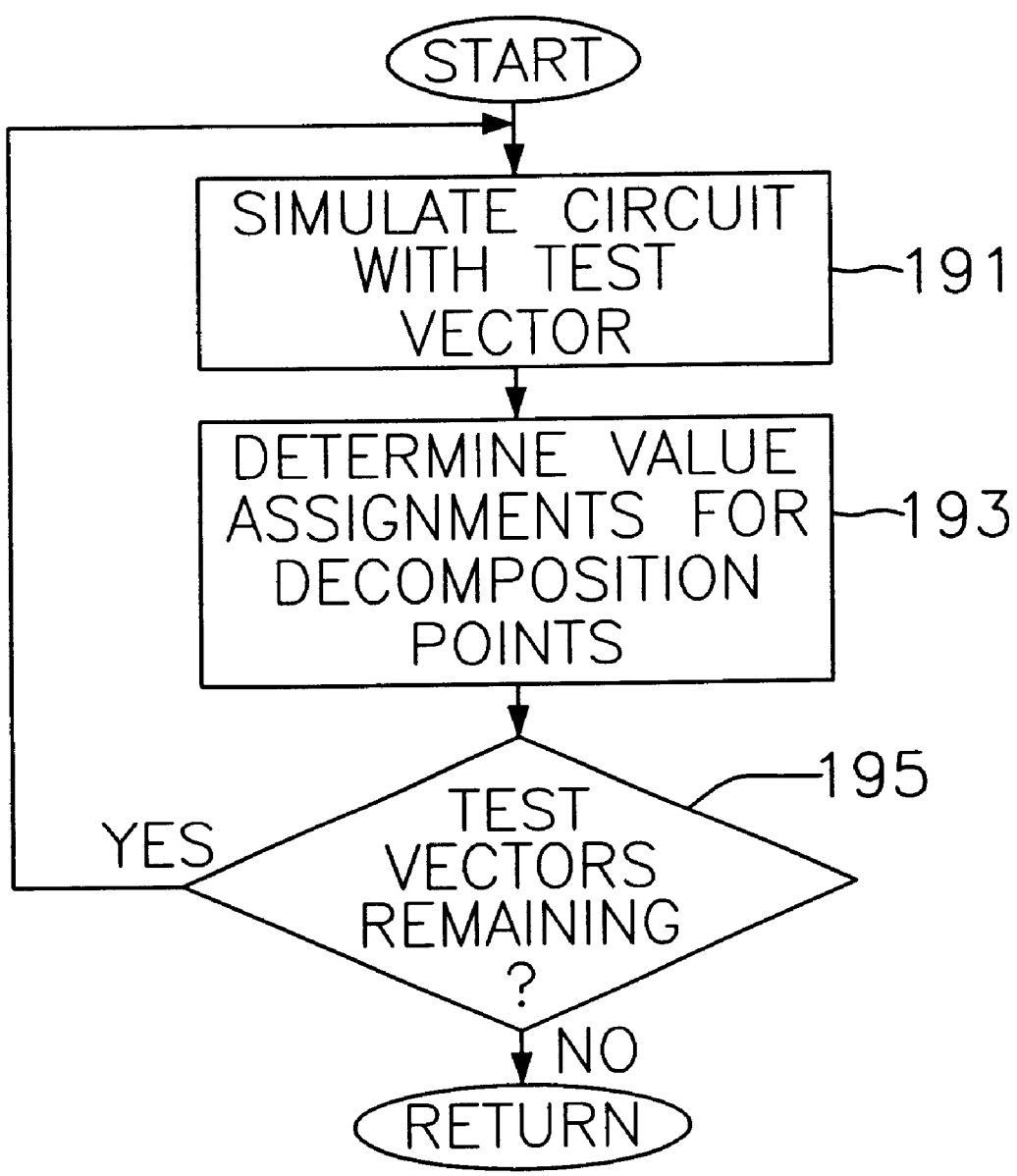
FIG. 15 is a flow diagram of a candidate order phase subprocess for decomposition point subspaces.

FIG. 15 illustrates a flow diagram of a subprocess of the estimation phase for determining decomposition point value assignments in a decomposition based subspace sampling scheme. In step 191 the process simulates the circuit design with a test vector. The test vector may be either specially designed for use with the subprocess of FIG. 14, or may be selected from a suite of test vectors. In step 193 the subprocess determines values to use at decomposition points. This is accomplished by examining the results of the circuit design simulation performed by the subprocess in step 191. Each test vector provides a set of assignments for all of the decomposition points in the circuit design. Accordingly, no set of decomposition point value assignments is formed which cannot occur during actual circuit operation. By examining values at nodes of the circuit design which correspond to decomposition points, it is therefore possible to avoid assignments of values which will not occur during operation of the circuit based on the circuit design. In step 195 the subprocess determines if further test vectors remain for simulation. If further test vectors remain for simulation the process returns to step 191 so that further assignment values may be obtained. If no further test vectors remain, then the subprocess returns.

B. Candidate Order Selection Phase

Figure 16:
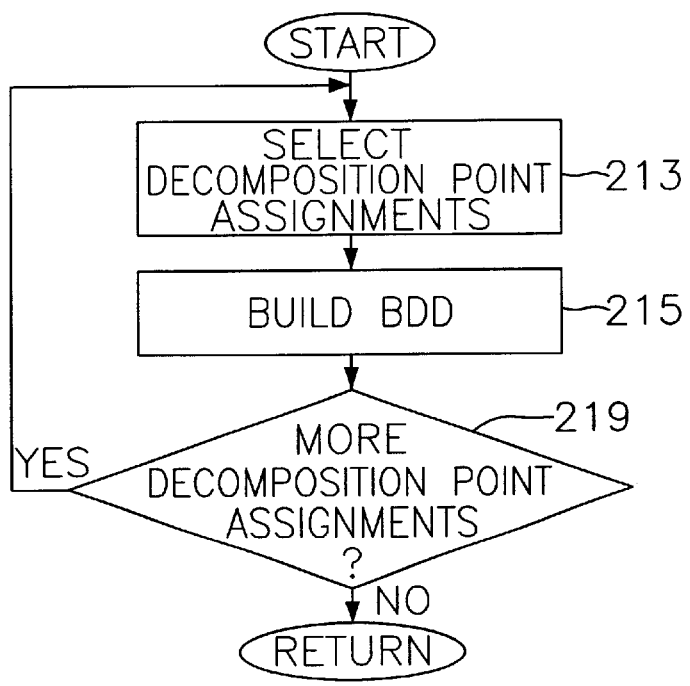
FIG. 16 is a flow diagram of an estimation phase subprocess for partial assignment subspaces.

FIG. 16 illustrates a flow diagram of a subprocess of the candidate order selection phase in decomposition subspace scheme. In step 213, the subprocess selects one of the sets of decomposition point value assignments developed during the estimation phase. Applying the value assignments to the decomposition points in effect modifies a function for the decomposition point to be either the logic one or logic zero portion of the Shannon expansion formula for that decomposition point. Using the decomposition point assignments from step 213 and the variable order used in the estimation phase in determining decomposition points, the subprocess builds a BDD in step 215 using the procedure detailed in Table II with dynamic reordering. As with abstraction based subspaces, the final variable orders used in building BDDs for subspaces formed using different decomposition point values are generally different due to the differing effects of dynamic variable reordering in different subspaces. Accordingly, each final variable order forms a candidate variable order. The subprocess determines if there are more decomposition point assignments available in step 219. If the subprocess determines that there are more decomposition point assignments, then the subprocess goes to step 213 selects another set of value assignments for the decomposition points. If the subprocess determines that there are no more decomposition point assignments, then the subprocess returns.

C. Testing

In the testing phase using decomposed BDDs the process uses the variable orders produced from the candidate order selection phase and discards the variable orders which appear to be ineffective. If a reduced sized BDD is built using the variable order, then the variable order is effective. If a large sized BDD is built using the variable order, then the variable order is ineffective.

In the testing phase using decomposed BDDs, the process uses the variable orders produced by the process in the candidate order selection phase and selects different decomposition points within the circuit design to build new BDDs. The process continues to build new BDDs for each of the variable orders produced by the process in the candidate order selection phase using different decomposition points. The size of the BDD created by the process during the testing phase determines the effectiveness or ineffectiveness of the variable order used.

D. Evolution

The evolution phase the process determines the final or best order from a set of variable orders generated by the process in the testing phase using decomposed BDDs. The refinement of the variable orders is performed by using the variable orders as initial orders for building BDDs using dynamic reordering for other selected Boolean subspaces within the circuit. The other Boolean subspaces are chosen by selecting other decomposition points within the circuit. However, as with the other methodologies, the other subspaces could be formed using other methods. More specifically, the methods of choosing subspaces in the various phase is, to an extent, independent of the methods used in other phases. Finally, the variable order which produces the smallest BDD for the different Boolean subspaces is selected to be the final variable order.

E. Building

The final building of the BDD for the circuit is performed by using the final variable order produced by the evolution phase using decomposed BDDs. Static or dynamic reordering can again be used with the final variable order to produce the final optimal BDD for the entire circuit.

F. Circuit Sampling

In circuit sampling Boolean subspaces are formed by selecting a subset of the gates or nodes that make up the circuit design or Boolean function.

IV. Methodology Using Partial Assignments

Partial assignments are also a process of segmenting a circuit into subspaces. By selecting a subset of primary inputs and assigning the selected subset of primary inputs values, the number of gates affecting the outcome at the primary outputs are limited.

A partial assignment is a Boolean assignment on a subset of primary input variables. If some of the primary input variables are assigned a Boolean value, then the portion of the Boolean space represented by the function dependent on those primary inputs is reduced in size. Accordingly, Boolean subspaces of a function can be created by using partial assignments.

More specifically, an assignment function over the set of variables J, where $|J|=k$, is a conjunction of k literals, one for each element of J. Thus, an assignment function A is a function which assigns true or false (0 or 1) to each element of J, depending on whether the corresponding literal is positive or negative in A. Function A is a partial assignment function over the set I if it is the assignment over J, for $J \subseteq I$. Thus, for a given set of primary input variables I a subset of primary input variables J is selected and assigned values. In other words, a set A of t randomly distinct assignment functions over J is selected. Thus, for a set of functions $S=\{f_a/a \in A\}$, each function in S is a sample of f.

A. Estimation Phase

The size and number of subspaces formed using partial assignments depends on the number of variables assigned values and the combinations of values assigned to those variables. Accordingly, during the estimation phase for a partitioning based subspace scheme these two items are determined.

Figure 17:
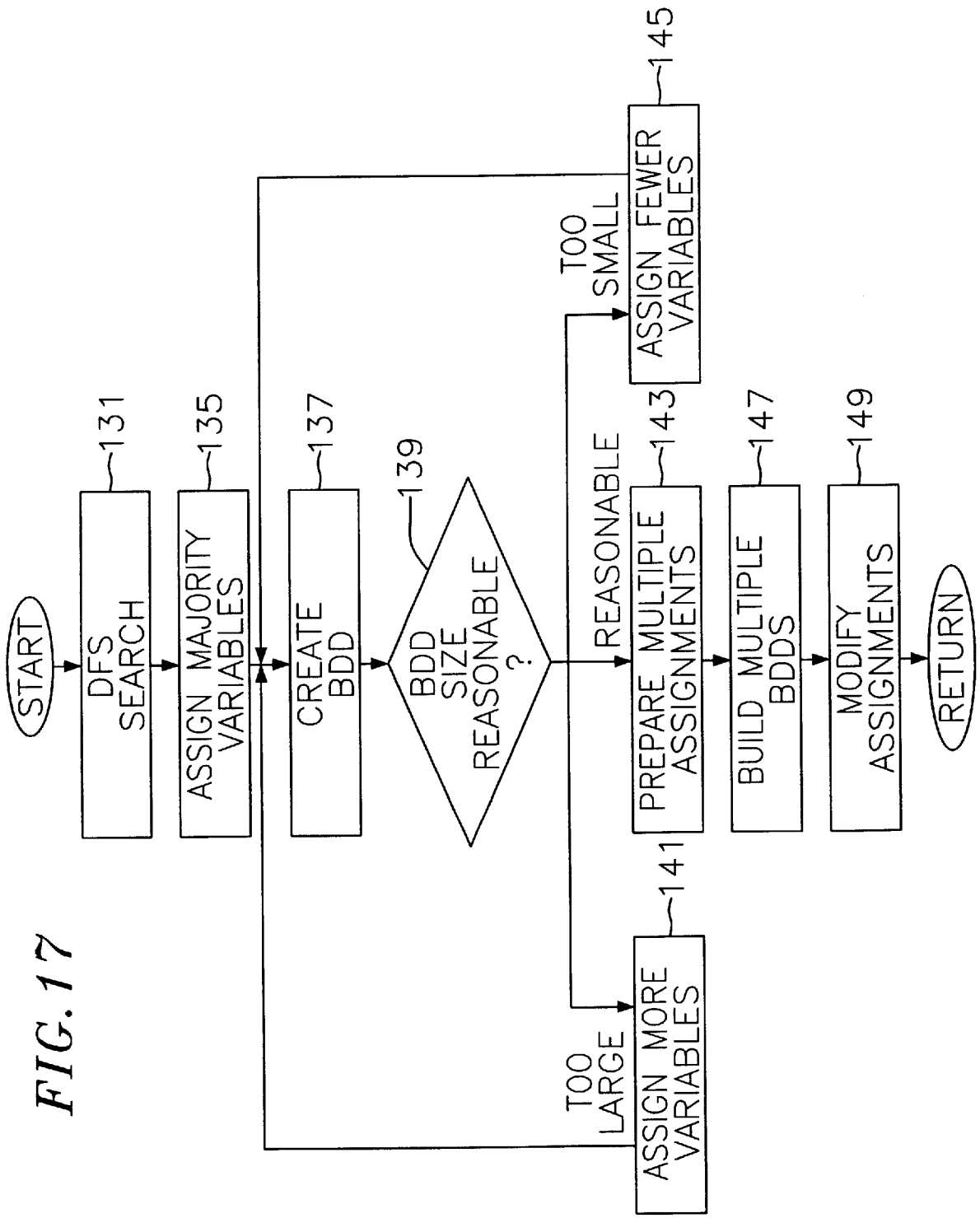
FIG. 17 is a flow diagram of a candidate order phase subprocess for partial assignment subspaces.

FIG. 17 illustrates a flow diagram of a subprocess of the estimation phase using partial assignments. In step 131, the subprocess orders the primary inputs, i.e. variables, using a depth-first search technique. Depth-first searches and methods for performing depth first-searches are well known in the art. In an alternative embodiment a priority depth-first search is used, and one skilled in the art would recognize that other methods could be used. In step 135, the subprocess assigns values to a large number (k) of the variables. In step 137, the subprocess creates multiple BDDs, with the k variables assigned values, with at least some of the values differing for different BDDs. In step 139, the subprocess determines if the average size of the BDDs created by the subprocess in step 137 is reasonable. The reasonableness in size of the BDD depends, in part, on computer architecture constraints for the computer system performing the process and the time provided for performing the process. If the BDDs created are too large, then the subprocess assigns values to more variables (i.e. increases it) in step 141 and the subprocess repeats steps 137 and 139. If the BDDs created are too small, then the subprocess assigns values to fewer variables (i.e. decreases it) in step 145 and the subprocess repeats steps 137 and 139. If the BDD sizes are reasonable, then the subprocess prepares multiple assignment sets for the k variables in step 143. The value assignment sets are taken from test vectors for the circuit, although in an alternative embodiment the value assignment sets are randomly generated. In step 147, the subprocess builds multiple BDDs with one BDD for each set of value assignments in step 143. In step 149, the subprocess further modifies the assignments and the subprocess returns. In one embodiment the subprocess modifies the assignments in step 149 to provide an equal fraction of controlling and non-controlling assignments. A controlling assignment is an assignment that causes a removal of a gate, such as assigning a zero at an input of an AND gate or a one at an input of an OR gate. A non-controlling assignment has an opposite effect of that of a controlling assignment. In an alternative embodiment assignments are chosen to maximize the number of non-controlling assignments, although any ratio of controlling to non-controlling assignments may be used. Furthermore the subprocess modifies the assignments in step 149 by avoiding the use of assignments or a subset of assignments which create a zero sized BDD.

B. Candidate Order Selection Phase

The candidate selection phase for a scheme using partial assignments to determine subspaces is similar to those for the other schemes. In other words, by building BDDs for subspaces defined by each of the partial assignment sets, using dynamic reordering, a different candidate variable order may be derived for each subspace. Because the first k variables in the depth-first search produced list are assigned values, however, the first k variables are not part of the dynamic reordering process. Accordingly, each of the candidate variable orders have the same first k variables if all subspaces include value assignments to those variables.

Figure 18:
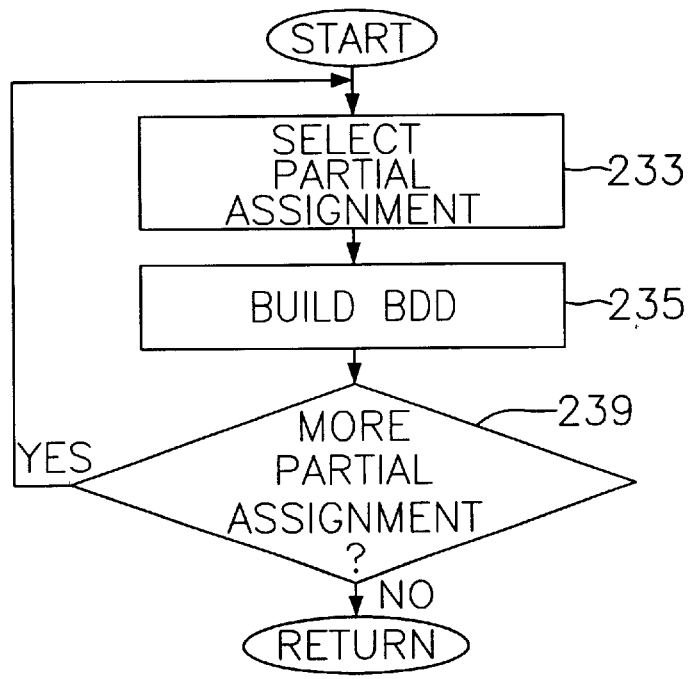
FIG. 18 illustrates a flow diagram of a subprocess of the candidate order selection phase using partial assignments.

FIG. 18 illustrates a flow diagram of a subprocess of the candidate order selection phase using partial assignments. In step 233, the subprocess selects a set of partial assignments, i.e., selects a set of values to assign to some of the variables. Using the partial assignments from step 233, the subprocess builds a BDD in step 235. In step 239 the subprocess determines if there are more partial assignments available. If the subprocess determines there are more partial assignments available, then the subprocess goes to step 233 and selects another partial assignment set. If the subprocess determines that there are no more partial assignments, then the subprocess returns.

C. Testing

At the end of the candidate order phase, the process has determined m variable orders. The process narrows the set of m variable orders to x variable orders in the testing phase by removing inefficient variable orders from the set of m variable orders.

Testing Scheme

In the testing phase the process uses the different orders produced by the process in the candidate order phase and the process discards the variable orders which are ineffective. If the variable order produces a small sized BDD, then the variable order is deemed effective. If the variable order produces an increased BDD size then the variable order is ineffective.

In the testing phase using partial assignments the process assigns the variable orders different values and then a BDD is built. By examining the size of the BDD, the process determines if the variable order is effective or ineffective. In another embodiment, the process assigns values to different variable orders and a BDD is built. Again, by examining the size of the BDD, the process determines the effectiveness or ineffectiveness of the variable order.

D. Evolution

In the evolution phase using partial assignments, the process determines the best order from the set of variable orders produced by the process in the testing phase.

The process builds BDDs for a new set of Boolean subspaces with dynamic reordering on using one of the m variable orders. The new set of Boolean subspaces are determined by the process by assigning values to a large number of primary inputs of the Boolean space. As a result, a set of small BDDs are rapidly built. The process continues by building BDDs for the set of Boolean subspaces with each one of the m variable orders. The variable order which produces the smallest sized BDD is determined by the process to be the best variable order.

The process includes the first few variables from a DFS-search order to the best variable order. That is, for assignment function a, we built and reordered BDDs for a $\Lambda$ $f_a$, rather than for $f_a$. Using the modified best variable order, the process builds BDDs for a second set of Boolean subspaces with dynamic reordering on. The second set of Boolean subspaces are determined by assigning values to a small number of primary inputs of the Boolean space. As a result, the variable order that produces the smallest sized BDD is determined by the process to be the final variable order for building the final BDD for the entire circuit.

E. Building

The final building of the BDD for the circuit is performed by using the final variable order produced by the evolution phase using partial assignments. Static or dynamic ordering processes can be used with the final variable order to produce the final optimal BDD for the circuit.

IV. Conclusion

Accordingly, the present invention provides a system and methodology for forming variable orders for building binary decision diagrams by sampling subspaces of a Boolean space representing a function or circuit design. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects illustrative and not restrictive, the scope of the invention to be indicated by the appended claims and their equivalents rather than the foregoing description.

What is claimed is:

1. A method of determining a variable order for building a Boolean Decision Diagram (BDD) for a Boolean function forming a Boolean space, the Boolean function representing a circuit design, comprising:

forming samples of the Boolean space representing the Boolean function;

building test BDDs for the samples using a plurality of test variable orders; and determining the variable order using information regarding the size of the test BDDs.

2. The method of claim 1 wherein the step of forming samples the Boolean space comprises obtaining subspaces using partial assignments.

3. The method of claim 1 wherein the step of forming samples the Boolean space comprises creating abstract BDDs.

4. The method of claim 1 wherein the step of forming samples of the Boolean space comprises creating decomposed BDDs.

5. The method of claims 2, 3 or 4 wherein the test BDDs are built using dynamic reordering.

6. The method of claims 2, 3, or 4 further comprising the step of estimating parameters, the parameters influencing the step of forming samples of the Boolean space.

7. The method of claim 6 wherein the step of estimating parameters comprises determining a set of primary input variables for abstraction.

8. The method of claim 7 wherein the determining the set of primary input variables for abstraction is accomplished by simulating a portion of the circuit design for a plurality of subsets of primary input variables.

9. The method of claim 8 wherein the set of primary input variables for abstraction is determined to be the subset of primary input variables which provide a maximum amount of coverage of the circuit design.

10. The method of claim 6 wherein the step of estimating parameters comprises determining a set of decomposition points.

11. The method of claim 10 wherein the decomposition points are determined randomly.

12. The method of claim 10 wherein the decomposition points are determined by nodes at which a BDD grows beyond a threshold value.

13. The method of claim 10 wherein the decomposition points are determined by nodes at which a BDD operation exceeds a predetermined computer resource amount.

14. The method of claim 11, 12, or 13 wherein the decomposition points are assigned a value.

15. The method of claim 14 wherein the decomposition points are assigned a value derived from a simulation of the circuit design.

16. A method of building BDDs representing a Boolean function, the Boolean function defining a Boolean space of a circuit design, comprising:
preprocessing the circuit design by examining a plurality of subspaces of the Boolean space of the circuit design;
determining a variable order based on the examination of the plurality of subspaces; and
building a BDD representing the Boolean function using the variable order as an initial variable order.

17. The method of claim 16 wherein the step of preprocessing comprises building BDDs for a plurality of subspaces using a plurality of possible variable orders for each subspace.

18. The method of claim 17 wherein the plurality of possible variable orders are initial variable orders and the building of BDDs is accomplished using dynamic variable reordering.

19. The method of claim 18 wherein the step of preprocessing further comprises selecting a plurality of secondary variable orders, the plurality of secondary variable orders forming a subset of the plurality of possible variable orders, based on a parameter related to the BDDs built in the building of the BDDs.

20. The method of claim 19 wherein the step of preprocessing further comprises building BDDS for a plurality of subspaces using the plurality of secondary variable orders.

21. A method using a computer for determining variable orders for a circuit design, the variable order being used to build binary decision diagrams (BDDs) of the circuit design, the circuit design having a set of primary inputs and outputs, comprising:

partitioning the circuit design;
building BDDs for portions of the partitioned circuit design using a set of variable orders; and
determining the effectiveness of the variable orders.

22. The method of claim 21 wherein determining the effectiveness of the variable orders depends on the sizes of the BDDs built using the variable order.

23. The method of claim 21 wherein partitioning the circuit design comprises:
simulating the circuit for subsets of primary input variables; and
selecting subset of primary input variables.

24. The method of claim 21 wherein building binary decision diagrams comprises:
selecting a set of variable orders; and
applying a set of abstraction functions using the set of variable orders.

25. A computer-implemented method of developing binary decision diagrams for a circuit, the circuit having a set of primary inputs and outputs and a set of logic components interconnected by nodes, comprising:
partitioning the circuit design;
building binary decision diagrams for subsets of the partitioned circuit design; and
evaluating the variable orders.

26. A computer-implemented method of creating reduced ordered binary decision diagrams for a circuit design comprising:
sampling at least one subspace of the circuit design; and
selecting a variable order based on the sampling of at least one subspace of the circuit design.

27. The computer-implemented method of claim 26 wherein selecting a variable order comprises:
building a first BDD for a subspace of the circuit design;
building a second BDD for a subspace of the circuit design; and
comparing parameters related to the first and second BDDs.

28. A method for determining an optimal variable order for building a BDD for a circuit design, the circuit design having a set of primary inputs and a set of primary outputs, comprising:
sampling the circuit design to produce samples;
testing variable orders using the samples produced by sampling the circuit design; and
refining the variable orders.

29. A method for determining an initial variable order for building a decision diagram for a function representing a circuit design, the circuit design having primary inputs, at least one primary output, and internal nodes, comprising:
determining an abstraction function;
building decision diagrams for a plurality of internal nodes;
applying the abstraction function to the decision diagrams for the plurality of internal nodes to obtain abstract decision diagrams for the plurality of internal nodes; and
building an abstract decision diagram for the at least one primary output using dynamic variable reordering, the abstract decision diagram for the at least one primary output being based in part on the abstract decision diagrams for the plurality of internal nodes.

30. The method of claim 29 wherein the abstract decision diagram for the at least one primary output has a final variable order, and the method further comprises selecting the final variable order as an initial variable order for building a decision diagram for the at least one primary output.

31. The method of claim 29 wherein the plurality of internal nodes comprises a cutset of the internal nodes of the circuit design.

32. The method of claim 29 further comprising:

determining a second abstraction function;

building decision diagrams for a plurality of internal nodes;

applying the second abstraction function to the decision diagrams for the plurality of internal nodes to obtain second abstract decision diagrams for the plurality of internal nodes;

building a second abstract decision diagram for the at least one primary output using dynamic variable reordering, the second abstract decision diagram for the at least one primary output being based in part on the second abstract decision diagrams for the plurality of internal nodes; and wherein the abstract decision diagram for the at least one primary output has a final variable order and the second abstract decision diagram for the at least one primary output has a second final variable order; and selecting between the final variable order and the second final variable order based on a comparison of parameters related to the abstract decision diagram for the at least one primary output and the second abstract decision diagram for the at least one primary output, the selection resulting in a selected variable order.

33. The method of claim 32 wherein the parameters are the size of the abstract decision diagram for the at least one primary output and the size of the second abstract decision diagram for the at least one primary output.

34. A method for determining an initial variable order for building a decision diagram for a function representing a circuit design, the circuit design having primary inputs, at least one primary output, and internal nodes, comprising:

building a decomposed decision diagram for the at least one primary output, the decomposed decision diagram having decomposition points;

assigning a first set of values to the decomposition points; and building a plurality of decision diagrams for the at least one primary output using the values assigned to the decomposition points, each of the plurality of decision diagrams using a different one of a plurality of initial variable orders.

35. The method of claim 34 wherein the decomposition points correspond to nodes of the circuit design, and method further comprises simulating the circuit design with at least one test vector, observing values at the nodes of the circuit design corresponding to the decomposition points, and forming the first set of values based on the observed values.

36. The method of claim 35 wherein the building the plurality of decision diagrams for the at least one primary output using the values assigned to the decomposition points is done using dynamic variable reordering.

* * * * *